United States Patent
Avanzino et al.

(10) Patent No.: US 6,548,336 B2
(45) Date of Patent: Apr. 15, 2003

(54) PLANARIZATION OF A POLYSILICON LAYER SURFACE BY CHEMICAL MECHANICAL POLISH TO IMPROVE LITHOGRAPHY AND SILICIDE FORMATION

(75) Inventors: Steven C. Avanzino, Cupertino, CA (US); Steven K. Park, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/067,765

(22) Filed: Feb. 8, 2002

(65) Prior Publication Data
US 2002/0072219 A1 Jun. 13, 2002

Related U.S. Application Data

(62) Division of application No. 09/538,168, filed on Mar. 30, 2000, now Pat. No. 6,346,466.

(51) Int. Cl.7 .......................................... H01L 21/8238
(52) U.S. Cl. ....................... 438/201; 438/142; 438/253; 438/258; 438/278
(58) Field of Search ................................. 438/201, 142, 438/253, 258, 278

(56) References Cited

U.S. PATENT DOCUMENTS

| | | | |
|---|---|---|---|
| 5,589,415 A | * 12/1996 | Blanchard | 438/229 |
| 5,774,327 A | 6/1998 | Park | 361/321.5 |
| 6,046,088 A | * 4/2000 | Klein et al. | 438/296 |
| 6,114,203 A | * 9/2000 | Ghidini et al. | 438/258 |
| 6,177,327 B1 | 1/2001 | Chao | 438/396 |
| 6,184,093 B1 | 2/2001 | Sung | 438/275 |
| 6,204,117 B1 | 3/2001 | Chiou et al. | 438/253 |

* cited by examiner

Primary Examiner—Michael S. Lebentritt
Assistant Examiner—Pho M. Luy
(74) Attorney, Agent, or Firm—Foley & Lardner

(57) ABSTRACT

A new device and technique to realize an improved integrated circuit device incorporates an improved polysilicon upper surface. This improvement is achieved by approximately planarizing an upper surface of the polysilicon layer. First, the polysilicon layer is preferably formed as a relatively thicker layer as compared to the layer thickness in a conventional device. Then a portion of the polysilicon layer is removed, preferably utilizing a chemical mechanical polish technique. Thus, this embodiment achieves a relatively planarized upper surface of the polysilicon layer. Then, for example, a conventional metal or silicide layer may be formed upon the relatively planarized polysilicon layer. This approximately planarized upper surface of the polysilicon layer allows for a silicide layer to be formed with a relative reduction in the amount and/or severity of the conventional word line voids and seams.

20 Claims, 4 Drawing Sheets

PLANARIZATION OF A POLYSILICON LAYER SURFACE BY CHEMICAL MECHANICAL POLISH TO IMPROVE LITHOGRAPHY AND SILICIDE FORMATION

CROSS-REFERENCE TO RELATED PATENT APPLICATIONS

This application is a division of application Ser. No. 09/538,168, now U.S. Pat. No. 6,346,466 filed Mar. 3, 2000, now pending, by Steven C. AVANZINO and Steven K. PARK. This application claims only subject matter disclosed in the parent application and therefore presents no new matter.

BACKGROUND OF THE INVENTION

The present invention relates generally to an integrated circuit ("IC"). More specifically, this invention relates to the fabrication of an integrated circuit having an improved polysilicon upper surface, by providing for an approximate planarization of this upper surface.

DESCRIPTION OF THE PRIOR ART

The present invention applies particularly to the fabrication of non-volatile memory integrated circuits. Some examples of non-volatile memory integrated circuits include an EPROM, an EEPROM, a flash memory device, and a complementary metal oxide silicon ("CMOS") type device. An exemplary device may comprise a field-effect transistor ("FET") containing a metal gate over thermal oxide over silicon ("MOSFET"), as well as other ultra-large-scale integrated-circuit ("ULSI") systems.

Non-volatile memory integrated circuits are utilized in a wide variety of commercial and military electronic devices, including, e.g., hand held telephones, radios and digital cameras. The market for these electronic devices continues to demand devices with a lower voltage, a lower power consumption and a decreased chip size. Also, the demand for greater functionality is driving the "design rule" lower, for example, into the sub-half micron range. The sub-half micron range may comprise, e.g., decreasing from a 0.35–0.25 micron technology to a 0.18 micron or a 0.15 micron technology, or even lower.

A portion of a conventional flash memory cell that comprises a flash memory IC is illustrated in FIG. 1. In referring to FIG. 1, a portion of a conventional flash memory cell fabrication process is described. It is understood by one skilled in the art that FIG. 1 is oriented such that the view is parallel to a word line.

FIG. 1 illustrates a cross-sectional view of the single flash memory cell 10 that is comprised of a conventional substrate 20. However, the respective source and drain regions are not shown. A' tunnel oxide ("$T_{ox}$") layer 30 is formed over the upper substrate portion 22, over which is formed a first polysilicon layer 44. The polysilicon layer 44 may be patterned, for example, by masking and etching. Next, an interpoly dielectric layer 52, e.g., Oxide Nitride Oxide ("ONO"), is formed over the first polysilicon layer 44. Then, a second polysilicon layer 61 is formed upon the interpoly dielectric layer 52. Finally, a conventional silicide layer 80 is formed upon the second polysilicon layer 61.

The memory device illustrated in FIG. 1 utilizes the first polysilicon layer 44 as a floating gate in order to store a data element. The floating gate is controlled by the second polysilicon layer 61 that functions as a control gate.

Specifically, in forming the second polysilicon layer 61 as shown in FIG. 1, a number of depressions 65 and crevices 67 are formed in an upper portion of the second polysilicon layer 61. Then, when the silicide layer 80 is deposited upon an upper portion of the second polysilicon layer 61, the silicide layer 80 adopts at least a portion of the depressions 65 and crevices 67 so as to form word line voids 85 and word line seams 87.

These word line voids 85 and seams 87 often substantially increase the word line resistance. Because the word line resistance is increased by these word line voids 85 and seams 87, the word line resistance increases as the design rule continues to shrink, respectively.

In addition, the deposition of the second polysilicon layer 61 is one of the most critical and difficult lithography design rule problems, because of the difficulty of the gate masking of the second polysilicon layer 61. After the second polysilicon layer 61 deposition is completed, the topography of the upper surface of the second polysilicon layer 61 is often severe enough to detrimentally impact the feature definition by photolithography. Further, the depressions 65 and crevices 67 result in a relatively poor silicide formation. Thus, the conventional method results in an ever deteriorating performance as the design rule continues to shrink.

What is needed is a device and method for improving the ability to form a second polysilicon layer to the design rule with less difficulty. What is also needed is a device and method for improving the ability to form a second polysilicon layer with a reduced and/or eliminated amount and/or severity of depressions and crevices that are conventionally formed in an upper portion of the second polysilicon layer. Finally, what is needed is a device and method for improving the ability to form a silicide layer with a reduced and/or eliminated amount and/or severity of word line voids and seams that are conventionally formed in an upper portion of the silicide layer.

SUMMARY OF THE INVENTION

Embodiments of the present invention are best understood by examining the detailed description and the appended claims with reference to the drawings. However, a brief summary of embodiments of the present invention follows.

Briefly described, an embodiment of the present invention comprises a device and a method that provides for an improved polysilicon layer upper surface. This improvement is achieved by approximately planarizing an upper surface of the second polysilicon layer that is adjacent the silicide layer.

First, the polysilicon layer is preferably formed as a relatively thicker layer as compared to the layer thickness in a conventional device. Then, a portion of the polysilicon layer is removed, preferably utilizing a chemical mechanical polish technique. Thus, this removal achieves a relatively, or approximately, planarized upper surface of the polysilicon layer. Then, for example, a conventional metal layer may be formed upon the relatively planarized polysilicon layer. This approximately planarized upper surface of the polysilicon layer allows for the silicide layer to be formed with a relative reduction in the amount and/or severity of the conventional word line voids and seams.

Other arrangements and modifications will be understood by examining the detailed description and the appended claims with reference to the drawings.

BRIEF DESCRIPTION OF THE DRAWINGS

Embodiments of the present invention are described in detail herein with reference to the drawings in which.

The accompanying drawings, wherein like numerals denote like elements, are incorporated into and constitute a part of the specification, and illustrate presently preferred exemplary embodiments of the invention. However, it is understood that the drawings are for the purpose of illustration only, and are not intended as a definition of the limits of the invention. Thus, the drawings, together with the general description given above, and the detailed description of the preferred embodiments given below, together with the appended claims, serve to explain the principles of the invention.

DETAILED DESCRIPTION OF THE PREFERRED EMBODIMENTS

Figure 2:
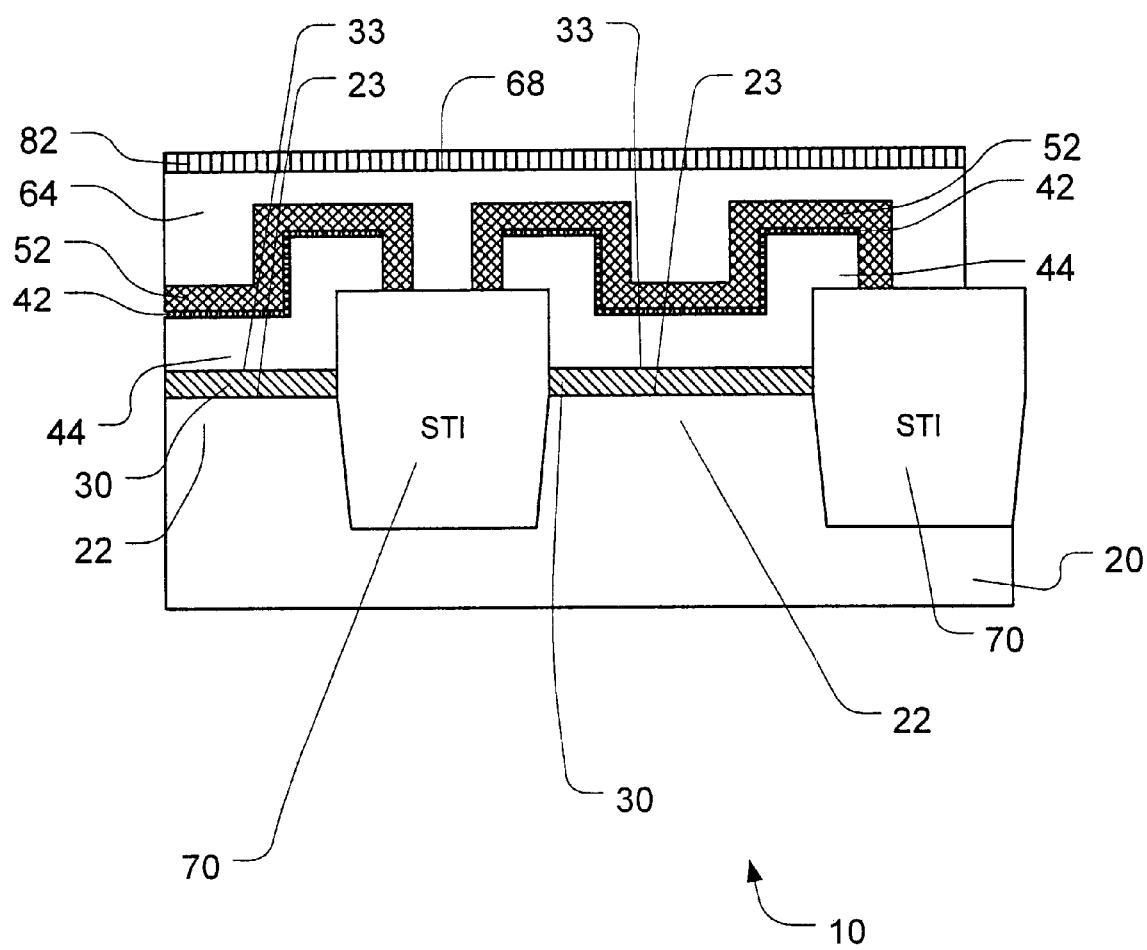
FIG. 2 illustrates a cross-sectional representation of a portion of a polysilicon gate structure of a flash memory device in accordance with the principles of an embodiment of the present invention.
Figure 3:
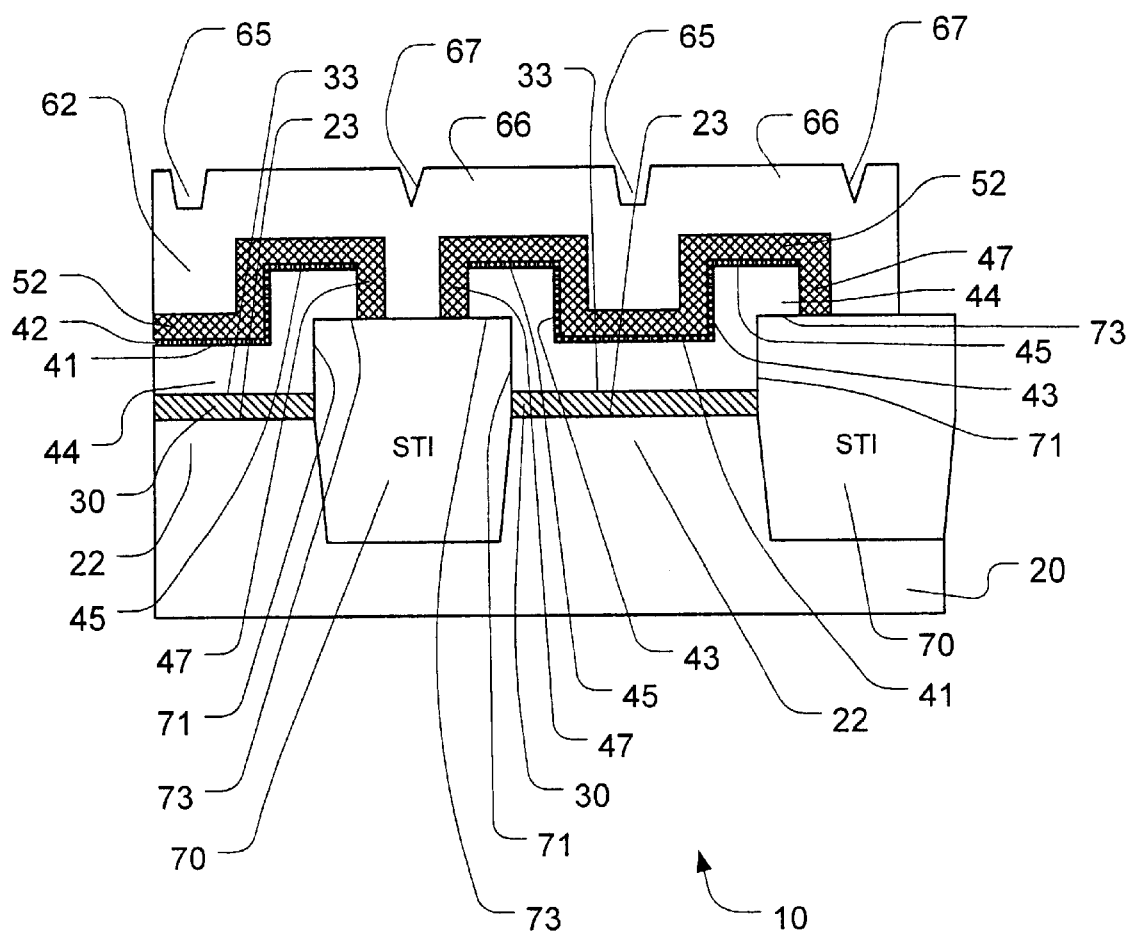
FIG. 3 is a cross-section of the polysilicon gate structure of FIG. 2, illustrating a shallow trench isolation, a tunnel oxide formation, a first conductive layer formation, an interpoly dielectric layer formation, and a second conductive layer formation in accordance with the principles of an embodiment of the present invention.
Figure 4:
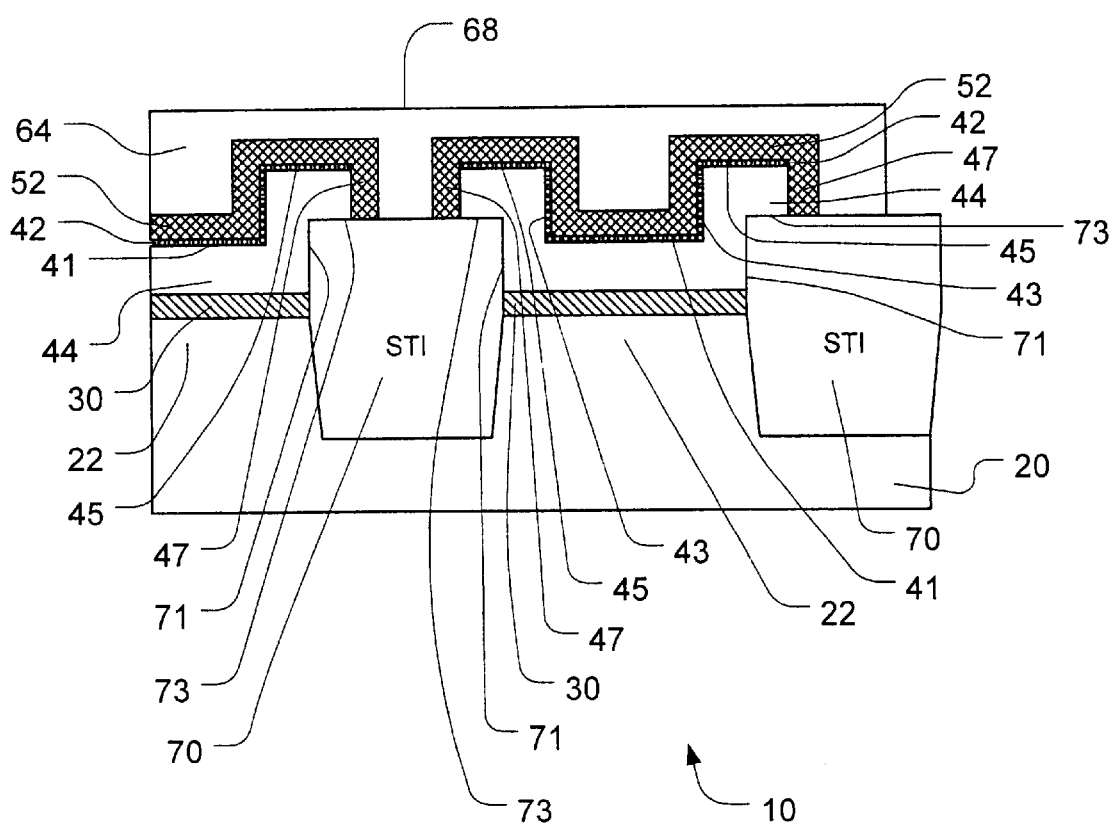
FIG. 4 is a cross-section of the polysilicon gate structure of FIG. 3, illustrating a removal of a portion of the second conductive layer in accordance with the principles of an embodiment of the present invention.

An embodiment of the present invention is illustrated utilizing a flash memory device. FIGS. 2–4 illustrate various techniques in the practice of the embodiments of the present invention. It will be understood by one skilled in the art that various components of the present invention as illustrated in FIGS. 2–4 are not shown in order to simplify the illustrations. It is also understood that FIGS. 2–4 are oriented such that the view is parallel to a word line.

FIG. 2 illustrates a memory device 10 that is comprised of a substrate 20. The substrate 20 includes an upper portion 22 that is generally located approximately between a source and drain region that are not shown. A shallow trench isolation ("STI") region 70 is located in the substrate 20, and the STI region 70 is formed so that at least a portion of the STI region 70 is elevated above the adjacent substrate top surface 23 of the substrate 20. Between each of the STI regions 70 a tunnel oxide ("$T_{ox}$") layer 30 is formed. The STI region 70 is formed so that at least a portion of the STI region 70 is also elevated above the adjacent tunnel oxide ("$T_{ox}$") layer top surface 33. It is understood that the $T_{ox}$ layer 30 is preferably relatively thin.

Then, formed and patterned upon the $T_{ox}$ layer 30, and at least a portion of the STI region 70, is a first conductive layer 44, e.g., polysilicon. The first conductive layer 44 may also comprise a roughed upper surface 42. Stacked upon the first conductive layer 44 is an interpoly dielectric layer 52. Stacked upon the interpoly dielectric layer 52 is a planarized second conductive layer 64, e.g., polysilicon. A silicide layer is then formed upon the planarized second conductive layer 64.

In alternate embodiments of the present invention, the term "substrate" may include a silicon-based substrate 20 as shown in FIGS. 2–4 or, e.g., a doped silicon, a gallium arsenide (GaAs), a gallium arsenide phosphide (GaAsP), a germanium, or a silicon germanium (SiGe) substrate. The "substrate" may also include any underlying material or materials that may be utilized, or upon which a device, a circuit, or an epitaxial layer may be formed. In other alternative embodiments, this "substrate" may include, for example, a tunnel oxide layer, or more generally any $SiO_2$ or Nitride, e.g., $Si_3N_4$, layer in addition to the semiconductor substrate portion 20. For example, in some embodiments, the substrate 20 may also comprise the $T_{ox}$ layer 30, while in other embodiments, the substrate 20 is considered to be separate from the $T_{ox}$ layer 30. In this regard, the term "substrate" is being utilized to generally define the elements for layers that underlie a layer or portions of interest. Also, the "substrate" may be a superconductor base or any other base on which a layer is formed, for example, a metal layer.

In the illustrated embodiment, an STI arrangement is utilized. The substrate may include an STI between each memory cell device. Devices that may comprise an STI type device include, for example, a metal oxide semiconductor field effect transistor ("MOSFET"), a memory cell, and other devices. Also, as is clear from the detailed description herein, together with the drawings, embodiments of the present invention may be practiced by utilizing current CMOS processes.

The method of forming the structure shown in FIG. 2 will now be described with reference to FIGS. 3–4.

First, as shown in FIG. 3, STI regions 70 are formed in substrate 20. Each STI region 70 is formed so that at least a portion of the STI region is exposed, i.e., elevated, above a top surface 23 of substrate 20.

In one embodiment, each STI region 70 comprises an exposed top surface 73 and an exposed side surface portion 71. These exposed parts of STI region 70 form a step-like structure between the STI top surface 73 and the substrate top surface 23. These topographical "steps" are achieved as part of the STI processing, and may be utilized to improve the coupling ratio.

In another stepped embodiment, these exposed parts of the STI region are also formed above a top surface 33 of the tunnel oxide layer 30, but comprise the same measured heights as described herein in relation to heights above the top surface of the substrate 22. Therefore, in this embodiment, the substrate further comprises the tunnel oxide layer and tunnel oxide layer top surface. Thus, in this embodiment, the heights and dimensions discussed herein are preferably measured from the top surface 33 of the tunnel oxide layer 30 to the STI top surface 73.

More specifically, in various embodiments of the present invention that comprise a stepped STI region 70, the following techniques may be utilized. Although FIG. 3 illustrates the end result of the following exemplary techniques, it will be understood by one skilled in the art that the following intermediate detailed techniques are omitted from FIG. 3 for clarity. An exemplary embodiment is also described.

First, an oxide layer, e.g., a pad oxide such as $SiO_2$, is deposited over the substrate top surface 23. The oxide layer may be deposited, e.g., at a thickness of between 100 to 500 Angstroms, and in this exemplary embodiment the oxide layer is deposited at about a 250 Angstrom layer thickness. However, in the practice of the present invention, any layer thickness of these exemplary embodiments may be increased or decreased, as desired, to adjust the step portion of the STI region 70, e.g., in order to tailor the coupling ratio.

Next, a barrier layer, e.g., a Silicon Nitride ("SN") such as $Si_3N_4$, may be deposited at a thickness, e.g., between 500 to 5,000 Angstroms. In the exemplary embodiment, the SN layer is deposited at about a 2,000 Angstrom layer thickness.

Then, an SiON layer may be deposited upon the SN layer. The SiON layer may be deposited, e.g., between about 50 to 3,000 Angstroms in thickness. The SiON layer is preferably between about 1% to 30% nitrogen content. In this exemplary embodiment, the Nitrogen content is about 10% Nitrogen, and the thickness is approximately 1,000 Angstroms.

Then, known masking, e.g., photoresist, and etching techniques may be utilized to remove the SiON, the SN, and the oxide layers that are located in the area where the STI region 70 will be formed. Also, at least some of the silicon substrate will be removed to form the trench for the STI region 70. This trench may be, e.g., between 2,000 to 7,000 Angstroms in depth. In this exemplary embodiment, the trench depth is approximately 4,000 Angstroms.

Then, the STI region trench is filled with an insulating material, e.g., utilizing a Plasma-Enhanced Chemical Vapor Deposition ("PECVD") oxide. The PECVD oxide may be achieved, e.g., by either an Ozone TetraEthylOrthoSilicate ("Ozone TEOS") technique or a High Density Plasma ("HDP") oxide technique. The HDP oxide technique, which does not require annealing immediately after the deposition, may be utilized in a preferred arrangement of the present invention, as compared to the Ozone TEOS technique, which does require annealing.

Next, to achieve the step portion of the STI region 70 between the STI top surface 73 and the substrate top surface 23, a Chemical Mechanical Polish ("CMP") is utilized to approximately planarize, e.g., the STI top surface 73 with the top of the remaining portion of the SiON layer. Then, the remaining portions of the SiON, SN, and oxide layers are removed, e.g., by utilizing either a wet or dry etch technique.

As will be understood from the above detailed description, the height of the step formed between the STI top surface 73 and the substrate top surface 23 will essentially be achieved by the thickness utilized in the deposition of each of the oxide, the SN, and the SiON layers, prior to the STI region trench formation. By adjusting any or all of these layer thicknesses, the step height may be adjusted so as to tailor the resulting coupling ratio.

As to adjusting the width of the STI region 70, the size of the STI masking and patterning may be varied. Thus, either separately, or in combination with any of the adjustments of the thickness of the layers, the width of the STI regions 70 may be utilized to further tailor the coupling ratio.

In the exemplary embodiment of the present invention, by utilizing an oxide layer of approximately 250 Angstroms, a SN layer of approximately 2,000 Angstroms, and an SiON layer of approximately 1,000 Angstroms, an STI step may be achieved that is approximately 3,250 Angstroms in height. The height is measured from the adjacent substrate top surface 23, to the STI top surface 73. However, the CMP step to planarize the trench-fill dielectric will remove approximately 500–1000 Angstroms of the SiON/SiN/oxide layer, and thus reduce the STI oxide step height above the substrate. Thus, in this exemplary embodiment, the step may be inclusively between approximately 3,000 Angstroms and approximately 4,000 Angstroms.

Also, as is understood from the above detailed description, a relatively large stepped STI region 70 may have a height of approximately 8,500 Angstroms. Further, a relatively small stepped STI region 70 may have a height of approximately 650 Angstroms. Of course, these heights are almost infinitely adjustable, at least within these exemplary measurements of relatively large and small heights.

As also shown in FIG. 3, a tunnel oxide layer 30 is formed upon the top surface 23 of substrate 20. The tunnel oxide layer 30 is formed between and is adjacent to a lower part of the exposed STI side surface portions 71. The tunnel oxide layer 30 is formed so that the STI regions 70 form spacers between the tunnel oxide layer 30 portion of each memory cell region. The tunnel oxide layer 30 may be formed by utilizing a tunnel oxide pre-clean and a tunnel oxidation technique. In one arrangement of the present invention, the thickness of the tunnel oxide layer 30 may be between approximately 80 Angstroms to 150 Angstroms, and is preferably about 100 Angstroms.

Next, as shown in FIG. 3, a first conductive layer 44, e.g., polysilicon, is patterned and formed upon the top surface 33 of the tunnel oxide layer 30, and upon the remaining exposed STI side surface portion 71, as well as a portion of the STI top surface 73 adjacent the memory cell area. After formation, the first conductive layer 44 of each memory cell preferably forms a channel-like structure for each memory cell.

As shown in FIG. 3, a step portion of the first conductive layer 44 is essentially defined by the first conductive layer side surfaces 43, 47 and the first conductive layer top surface 45, in cooperation with the STI side surface portion 71 and a part of the STI top surface 73. These areas comprise the step-like structure, or portion, of the first conductive layer 44. This step portion may, for example, be adjusted by varying the exposed amount of the STI side surface portion 71 above the substrate top surface 23, and the size of the STI top surface 73.

Next, as is illustrated in FIG. 3, at least portions of the first conductive layer 44 are roughened. The portions to be roughened may include the channel top surface 41, side surfaces 43, and upper top surfaces 45 of the first conductive layer 44. Thus, the roughened upper surface 42 of first conductive layer 44 is formed. However, in a preferred arrangement, the side surfaces 47 of first conductive layer 44 and the remaining exposed top surface 73 of STI region 70 are preferably not roughened.

The roughened upper surface 42 may be achieved by a number of techniques. In one arrangement, an argon plasma sputtering technique may be utilized to roughen the upper surface. In another arrangement, a chemically induced anisotropic wet etch process along the crystal boundaries may be utilized to fabricate the roughened surface 42 of the first conductive layer 44. Also, a technique of controlling or modifying at least one deposition condition, e.g., temperature, in order to alter at least one of a film morphology, a grain structure, and a grain size may be utilized.

Then, as illustrated in FIG. 3, an interpoly dielectric layer 52 is formed over the exposed and roughened surfaces 41, 43, 45 of the first conductive layer 44. The interpoly dielectric layer 52 may be formed or grown by conventional techniques upon preferably all of the exposed and roughened surfaces of the first conductive layer 44. However, the interpoly dielectric layer 52 is preferably not formed upon the remaining exposed portion of the STI top surface 73. The interpoly dielectric layer 52 may comprise, e.g., an Oxide Nitride Oxide ("ONO") layer. The ONO layer preferably comprises successive layers of silicon dioxide, silicon nitride and silicon dioxide.

Specifically, in an exemplary embodiment, the ONO or interpoly dielectric layer 52 may comprise a composite material that is both grown and deposited. First, the first conductive layer 44, comprising polysilicon gate, is oxidized in a furnace to produce a thin grown $SiO_2$ film on the top and all exposed sides of the first conductive layer 44, but not on the STI field or region 70. Next, a nitride such as $Si_3N_4$ is deposited by Chemical Vapor Deposition ("CVD") to cover the first conductive polysilicon gate layer 44, and the STI region 70. Finally, the surface of the nitride is oxidized in a furnace so as to convert the surface to a layer of $SiO_2$. This results in a three layer or ONO interpoly dielectric layer 52 formed over the first conductive layer 44. In this arrangement, although not shown, the top two layers that comprise $Si_3N_4$ and $SiO_2$, of the three layer ONO, may also be formed over the STI region 70.

In one embodiment, the interpoly dielectric layer 52 may be removed from a periphery area that is not shown. The periphery area may include, e.g., any area other than the cell array area, such as a charge pump area, a logic circuit area, and a decoder area.

Next, as illustrated in FIG. 3, a second conductive layer 62, e.g., polysilicon, is formed conventionally upon the exposed surfaces of the interpoly dielectric layer 52. The second conductive layer 62 is also formed upon the remaining exposed STI top surface 73.

As shown in FIG. 3, the second conductive layer 62 also comprises various upper surface defects such as the illustrated depressions 65 and crevices 67. It is understood by one skilled in the art that the second conductive layer 62 of a preferred embodiment of the present invention is deposited in a manner such that the average thickness is approximately twice the thickness that is conventionally utilized in the formation of this exemplary layer, e.g., as is shown for the conventional device in FIG. 1. Thus, for example, the second conductive layer 62 may be formed at an average thickness of about 3,000 to 4,000 Angstroms. However, other thicknesses may be utilized in alternate embodiments.

Next, as shown in FIG. 3, an upper portion 66 of the second conductive layer 62 is removed to a controlled thickness so as to form the remaining, or approximately planarized, second conductive layer 64 as shown in FIG. 4. For example, a chemical mechanical polish may be utilized to approximately smooth, or flatten, the upper surface by removing the upper portion 66 of the relatively thick second conductive layer 62 shown in FIG. 3. This removal results in the approximately planarized upper surface 68 of the second conductive layer 64 as shown in FIG. 4.

Next, as shown in FIG. 2, a silicide layer 82 is formed upon the exposed surfaces of the approximately planarized upper surface 68 of the second conductive layer 64, by utilizing conventional techniques. It is understood that the silicide layer 82 is also approximately planarized, in part because of the improved approximately planarized upper surface 68 of the second conductive layer 62.

Any additional steps in the formation of the memory device 10, e.g., a second conductive layer gate patterning, are not shown for clarity.

It will be understood by one skilled in the art that the approximate planarization of the upper surface 68 of the second polysilicon layer 64 allows for an improved masking technique. In a conventional device, the second polysilicon layer gate masking is often the most difficult to hold to the design rule, and so may be considered one of the most difficult portions of the fabrication effort. By instead depositing a thicker second polysilicon layer 62, that is shown prior to planarization in FIG. 3, the second polysilicon layer gate masking may be more easily accomplished, e.g., by an improved focus capability in the photolithography, resulting in a better feature definition. Thus, the shrinking design rule may be more easily satisfied.

Figure 1:
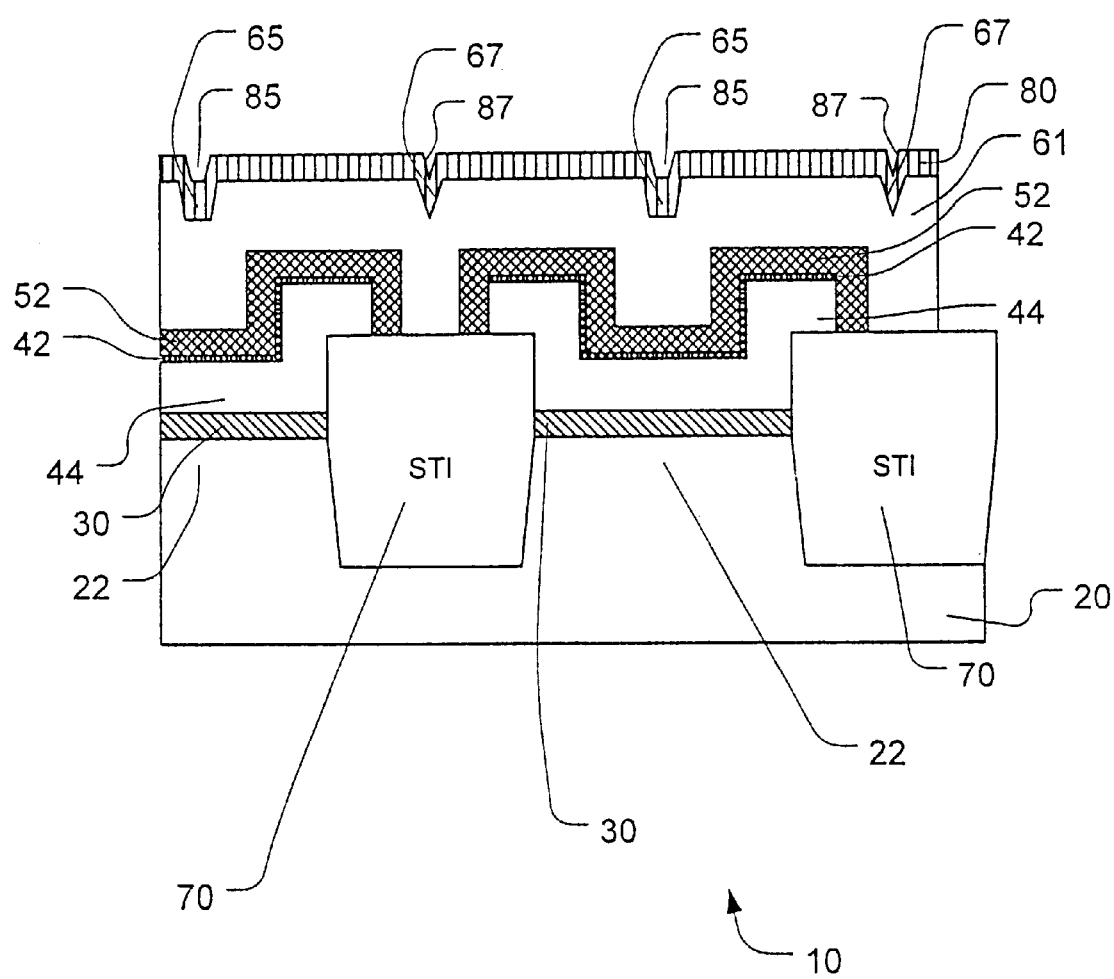
FIG. 1 illustrates a cross-sectional representation of a portion of a conventional polysilicon gate structure of a flash memory device.

It will also be understood that the word line resistance may be improved. The word line resistance is improved, for example, by reducing or eliminating the various conventional deformities, such as the word line voids 85 and seams 87 that are conventionally formed in silicide layer 80 as shown in FIG. 1. These conventional word line deformities comprised a direct mapping of the conventional deformities of the depressions 65 and crevices 67 formed in the second polysilicon layer 61 as shown in FIG. 1.

In contrast, the relatively planarized upper surface 68 of the approximately planarized second polysilicon layer 64 provides for an approximately planarized silicide layer 82, as shown in FIG. 2. This approximately planarized silicide layer 82 has a relatively reduced amount and/or an elimination of the various deformities that are present in the conventional silicide layer 80 of FIG. 1. Therefore, the word line resistance may be relatively reduced in a preferred embodiment of the present invention, as compared to the conventional device illustrated in FIG. 1.

Thus, embodiments of the present invention may comprise a device and method for improving the ability to form a second polysilicon layer to the design rule with less difficulty. Also, embodiments of the present invention may comprise a device and method for improving the ability to form a second polysilicon layer with a reduced and/or eliminated amount and/or severity of depressions and crevices that are conventionally formed in an upper portion of the second polysilicon layer. Finally, embodiments of the present invention may comprise a device and method for improving the ability to form a silicide layer with a reduced and/or eliminated amount and/or severity of word line voids and seams that are conventionally formed in an upper portion of the silicide layer.

The invention has been described in reference to particular embodiments as set forth above. However, only the preferred embodiments of the present invention, and several examples of its versatility are shown and described in the present disclosure. It is to be understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A method of fabricating a circuit device having a substrate, comprising the steps of:
   a. forming a first conductive layer over the substrate,
   b. forming an interpoly dielectric layer upon the first conductive layer,
   c. forming a second conductive layer upon the interpoly dielectric layer, and
   d. removing a portion of the second conductive layer so as to approximately planarize an upper surface of the second conductive layer.

2. A method as recited in claim 1, wherein the forming a second conductive layer step further comprises:
   depositing a polysilicon layer of approximately 3,000 to 4,000 Angstroms in thickness, prior to the removing step.

3. A method as recited in claim 2, wherein the removing step further comprises:
   removing a portion of the polysilicon layer so as to leave the polysilicon layer with a remaining approximate thickness of 1,000 to 2,000 Angstroms.

4. A method as recited in claim 3, wherein the removing step further comprises:
   utilizing a chemical mechanical polish technique to remove a portion of the polysilicon layer.

5. A method as recited in claim 1, wherein the removing step further comprises:

removing a portion of the second conductive layer so as to leave the second conductive layer with a remaining approximate thickness of 1,000 to 2,000 Angstroms.

6. A method as recited in claim 1, wherein the removing step further comprises:

utilizing a chemical mechanical polish technique to remove a portion of the second conductive layer.

7. A method as recited in claim 1, further comprising the steps of:

forming a plurality of shallow trench isolation regions in the substrate, wherein each shallow trench isolation region has a portion of a side surface that extends above an adjacent substrate surface, forming the first conductive layer over the substrate and over at least a portion of two opposing side surfaces of corresponding shallow trench isolation regions, so that a channel portion is formed in the first conductive layer, forming the interpoly dielectric layer upon the first conductive layer, including the channel portion, and forming the second conductive layer upon the interpoly dielectric layer, including the portion of the interpoly dielectric layer covering the channel portion.

8. A method as recited in claim 1, further comprising the step of:

roughening a top surface of the first conductive layer, prior to forming the interpoly dielectric layer.

9. A method of fabricating a circuit device having a substrate, comprising the steps of:

a. forming a plurality of shallow trench isolation regions in the substrate, wherein each shallow trench isolation region has a portion of a side surface that extends above an adjacent substrate surface, b. forming a first conductive layer over the substrate and over at least a portion of two opposing side surfaces of corresponding shallow trench isolation, c. forming an interpoly dielectric layer upon the first conductive layer, d. forming a second conductive layer upon the interpoly dielectric layer, and e. removing a portion of the second conductive layer so as to approximately smooth an upper surface of the second conductive layer.

10. A method as recited in claim 9, wherein the forming a second conductive layer step further comprises:

depositing a polysilicon layer of approximately 3,000 to 4,000 Angstroms in thickness, prior to the removing step.

11. A method as recited in claim 10, wherein the removing step further comprises:

removing a portion of the polysilicon layer so as to leave the polysilicon layer with a remaining approximate thickness of 1,000 to 2,000 Angstroms.

12. A method as recited in claim 11, wherein the removing step further comprises:

utilizing a chemical mechanical polish technique to remove a portion of the polysilicon layer.

13. A method as recited in claim 9, wherein the removing step further comprises:

removing a portion of the second conductive layer so as to leave the second conductive layer with a remaining approximate thickness of 1,000 to 2,000 Angstroms.

14. A method as recited in claim 9, wherein the removing step further comprises:

utilizing a chemical mechanical polish technique to remove a portion of the second conductive layer.

15. A method as recited in claim 9, comprising the additional step of:

forming a tunnel oxide layer that further comprises a portion of the substrate, wherein the tunnel oxide layer is sandwiched between at least a portion of the substrate and at least a portion of the first conductive layer, and wherein each shallow trench isolation region has a portion of a side surface that extends above an adjacent tunnel oxide layer top surface.

16. A method as recited in claim 9, wherein the first and second conductive layers comprise polysilicon.

17. A method as recited in claim 9, wherein the circuit device comprises at least one of
i. a semiconductor non-volatile memory device, and
ii. a field effect transistor.

18. A method a recited in claim 9, further comprising the step of:

forming a silicide layer upon the approximately smooth upper surface of the second conductive layer.

19. A method of fabricating a circuit device having a substrate, comprising:

a. forming the first conductive layer over the substrate and over at least a portion of two opposing side surfaces of corresponding shallow trench isolation regions, so that a channel portion is formed in the first conductive layer, b. forming a plurality of shallow trench isolation regions in the substrate, wherein each shallow trench isolation region has a portion of a side surface that extends above an adjacent substrate surface, c. forming the interpoly dielectric layer upon the first conductive layer, including the channel portion;

d. forming the second conductive layer upon the interpoly dielectric layer, including the portion of the interpoly dielectric layer covering the channel portion; and e. removing a portion of the second conductive layer so as to approximately planarize an upper surface of the second conductive layer.

20. A method of fabricating a circuit device having a substrate, comprising:

a. forming a plurality of shallow trench isolation regions in the substrate, wherein each shallow trench isolation region has a portion of a side surface that extends above an adjacent substrate surface;

b. forming a tunnel oxide layer that further comprises a portion of the substrate;

c. forming a first conductive layer over the substrate and over at least a portion of two opposing side surfaces of corresponding shallow trench isolation, wherein the tunnel oxide layer is sandwiched between at least a portion of the substrate and at least a portion of the first conductive layer, and wherein each shallow trench isolation region has a portion of a side surface that extends above an adjacent tunnel oxide layer top surface;

d. forming an interpoly dielectric layer upon the first conductive layer;

e. forming a second conductive layer upon the interpoly dielectric layer; and f. removing a portion of the second conductive layer so as to approximately smooth an upper surface of the second conductive layer.

* * * * *